(12) United States Patent
Chae et al.

(10) Patent No.: US 7,662,763 B2
(45) Date of Patent: Feb. 16, 2010

(54) COMPOSITION AND METHOD FOR REMOVING COPPER-COMPATIBLE RESIST

(75) Inventors: Gee-Sung Chae, Incheongwangyeok-si (KR); Yong-Sup Hwang, Gyeonggi-do (KR); Cyoo-Chul Jo, Gyeonggi-do (KR); Oh-Nam Kwon, Chungcheongnam-do (KR); Kyoung-Mook Lee, Seoul (KR); Byung-Uk Kim, Gyeonggi-do (KR); Sang-Dai Lee, Gyeonggi-do (KR); Jong-Soon Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 545 days.

(21) Appl. No.: 11/185,856

(22) Filed: Jul. 21, 2005

(65) Prior Publication Data

US 2005/0272621 A1 Dec. 8, 2005

Related U.S. Application Data

(62) Division of application No. 10/267,047, filed on Oct. 9, 2002, now Pat. No. 6,958,312.

(30) Foreign Application Priority Data

Oct. 10, 2001 (KR) ............................. 2001-62527

(51) Int. Cl.
*C11D 7/50* (2006.01)

(52) U.S. Cl. ........................................ 510/175; 134/1.3
(58) Field of Classification Search ................. 510/175; 134/1.3
See application file for complete search history.

(56) References Cited

U.S. PATENT DOCUMENTS

| 5,417,877 | A | | 5/1995 | Ward |
| 5,556,482 | A | | 9/1996 | Ward et al. |
| 5,795,702 | A | * | 8/1998 | Tanabe et al. ............... 430/331 |
| 5,968,848 | A | | 10/1999 | Tanabe et al. ............... 438/745 |
| 6,218,087 | B1 | * | 4/2001 | Tanabe et al. ............... 430/331 |
| 6,440,326 | B1 | * | 8/2002 | Maruyama et al. ......... 252/79.1 |
| 6,500,270 | B2 | | 12/2002 | Nohara et al. ................... 134/2 |
| 6,524,376 | B2 | | 2/2003 | Aoki et al. ............... 106/14.42 |
| 2001/0021489 | A1 | * | 9/2001 | Wakiya et al. .............. 430/329 |
| 2002/0128164 | A1 | | 9/2002 | Hara et al. ................... 510/175 |
| 2003/0181344 | A1 | | 9/2003 | Ikemoto et al. ............. 510/175 |

FOREIGN PATENT DOCUMENTS

KR 2001-0018377 3/2001

* cited by examiner

*Primary Examiner*—Gregory E Webb
(74) *Attorney, Agent, or Firm*—McKenna Long & Aldridge LLP

(57) ABSTRACT

A composition for removing a copper-compatible resist includes about 10% to about 30% by weight of an amine compound, about 10% to about 80% by weight of a glycolether compound, and about 10% to about 80% by weight of a polar solvent.

7 Claims, 6 Drawing Sheets

COMPOSITION AND METHOD FOR REMOVING COPPER-COMPATIBLE RESIST

This application is a divisional of application Ser. No. 10/267,047, filed Oct. 9, 2002, now U.S. Pat. No. 6,958,312 which claims priority to Korean Patent Application No. 10-2001-62527, filed Oct. 10, 2001, each of which are incorporated by reference for all purposes as if fully set forth herein.

BACKGROUND OF THE INVENTION

1. Field of the Invention

The present invention relates to a composition for removing copper (Cu)-compatible resist, and more particularly, to a composition for removing copper-compatible resist without corrosion of copper.

2. Discussion of the Related Art

In general, a low resistance copper line is commonly used as an array line of an array substrate for a liquid crystal display (LCD) device, or in a circuit line of a semiconductor device to prevent resistance-capacitance (RC) delay. The copper line is commonly formed using a photolithographic process incorporating fine pattern technology. The photolithographic process is commonly used for fabricating semiconductor devices such as large scale integrated (LSI) circuits, very large scale integrated (VLSI) circuits, and display devices including LCD and plasma panel display (PDP) devices.

FIG. 1 is a perspective view of a liquid crystal display device using a copper line according to the related art. In FIG. 1, a liquid crystal display (LCD) device 11 includes an upper substrate 5, a lower substrate 10, and a liquid crystal material layer 9 interposed between the upper and lower substrates 5 and 10. The upper substrate 5 includes a color filter layer 7, a black matrix 6, and a common electrode 18. The lower substrate 10 includes a pixel electrodes 17 formed at pixel regions "P," and thin film transistors (TFTs) "T" that function as switching devices. The TFTs "T" are disposed in a matrix configuration and gate and data lines 14 and 22 are connected to each of the TFTs "T." The pixel regions "P" are each defined by a crossing of the gate and data lines 14 and 22, and a transparent pixel electrode 17 is formed at each of the pixel regions "P." The transparent pixel electrode 17 and the common electrode 18 are made of a transparent conductive metal such as indium-tin-oxide (ITO) and indium-zinc-oxide (IZO), and the LCD device is driven by utilizing an electro-optical effect of the liquid crystal material layer 9. Accordingly, the gate line 14 should be made of a low resistance material such as copper (Cu), and should be formed using a photolithographic process incorporating fine pattern technology.

FIGS. 2A to 2E are cross-sectional views of a photolithographic process for forming a metal line according to the related art. In FIG. 2A, a metal layer 32 is formed on a substrate 30 by deposition of a metallic material. Next, a photoresist (PR) 34 of positive or negative type is formed on the metal layer 32. In FIGS. 2A to 2E, a positive type PR will be illustrated. Even though the PR 34 may be formed on an entire or a predetermined region of the substrate 30, the PR 34 is generally formed on the entire region of the substrate 30.

In FIG. 2B, a photo mask 36 is disposed over the PR 34 of the substrate 30. Next, an exposure process is performed, wherein a light "L" such as an ultra violet (UV) ray and an X ray is irradiated onto the photo mask 36. The photo mask 36 includes a transmitting portion "T" and a shielding portion "S," wherein the light that passes through the transmitting portion "T" transforms the PR 34. Accordingly, the PR 34 includes a first portion "A" where a material property of the PR 34 is maintained and a second portion "B" where a material property of the PR 34 is transformed. Since the PR 34 is potentially patterned according to the photo mask 36, this pattern of the PR 34 is referred to as a latent image.

In FIG. 2C, the PR 34 (of FIG. 2B) having the latent image is developed to form a resist pattern 35 that corresponds to the photo mask 36 (of FIG. 2B). Specifically, the first portion "A" (of FIG. 2B) where the light "L" (of FIG. 2B) is not irradiated remains to cover the metal layer 32 and the second portion (of FIG. 2B) where the light "L" (of FIG. 2B) is irradiated is eliminated to expose the metal layer 32.

In FIG. 2D, the metal layer 32 (of FIG. 2C) is etched using the resist pattern 35 as an etching mask, whereby a metal line of a specific shape is formed on the substrate 30.

In FIG. 2E, the resist pattern 35 (of FIG. 2D) is eliminated and the metal line 38 of the specific shape is exposed.

However, the metal line formed of copper may be easily corroded by conventional solvents that are used to remove the resist pattern during the photolithographic process. Accordingly, solvent compositions that include a corrosion inhibitor for preventing corrosion of copper may be used, as demonstrated by U.S. Pat. Nos. 5,417,877 and 5,556,482, which are hereby incorporated by reference. The corrosion inhibitors include mono-ethanol-amine (MEA) as a preferred amine. In addition, a specific amount of corrosion inhibitor is required so that a removing property of the inhibitor is not degraded.

SUMMARY OF THE INVENTION

Accordingly, the present invention is directed to a composition for removing a copper-compatible resist that substantially obviates one or more of problems due to limitations and disadvantages of the related art.

An object of the present invention is to provide an improved composition for removing a copper-compatible resist.

Another object of the present invention is to provide a composition for removing a copper-compatible resist without a corrosion of a copper line when the copper line is substituted for an aluminum line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a composition for removing a copper-compatible resist includes about 10% to about 30% by weight of an amine compound, about 10% to about 80% by weight of a glycolether compound, and about 10% to about 80% by weight of a polar solvent.

In another aspect, a method for removing a copper-compatible resist including combining about 10% to about 30% by weight of an amine compound with about 10% to about 80% by weight of a glycolether compound and about 10% to about 80% by weight of a polar solvent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
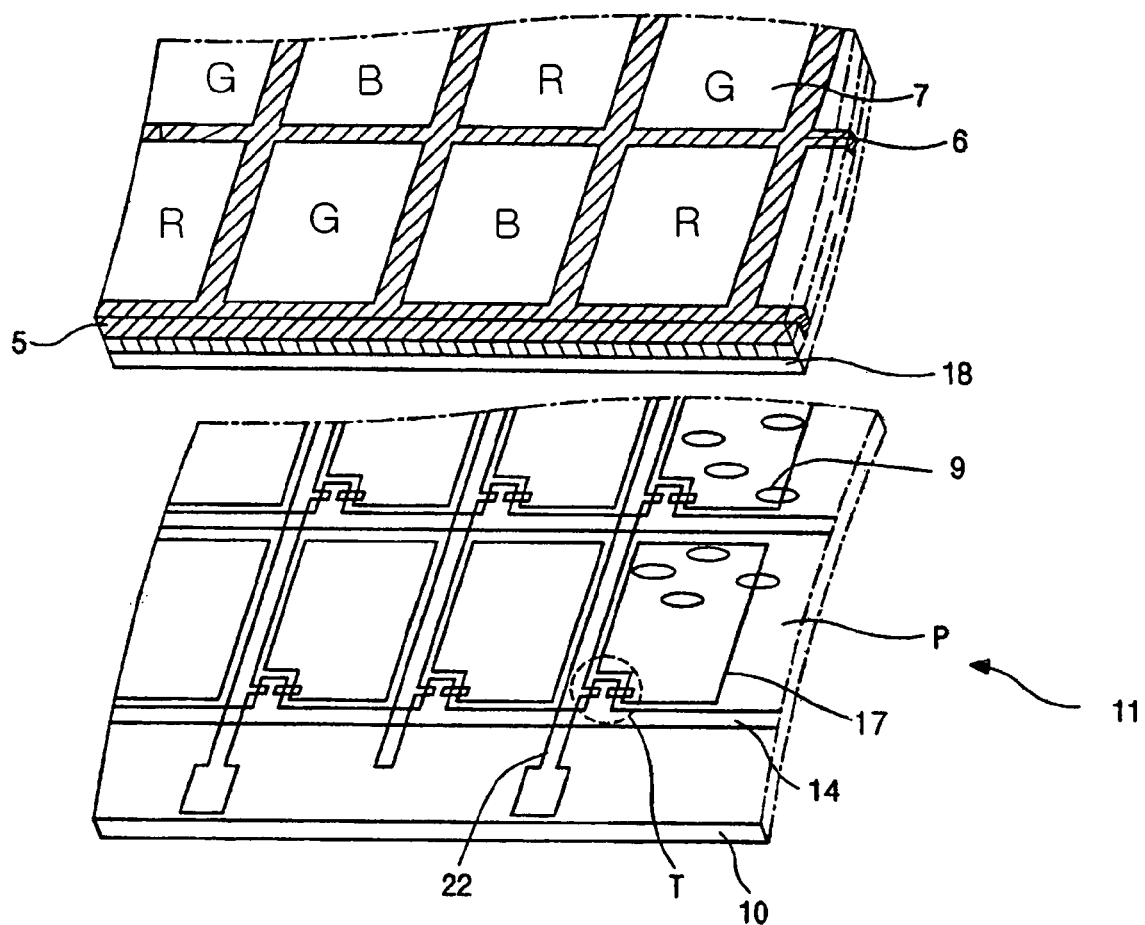
FIG. 1 is a perspective view of a liquid crystal display device using a copper line according to the related art.
Figure 2A:
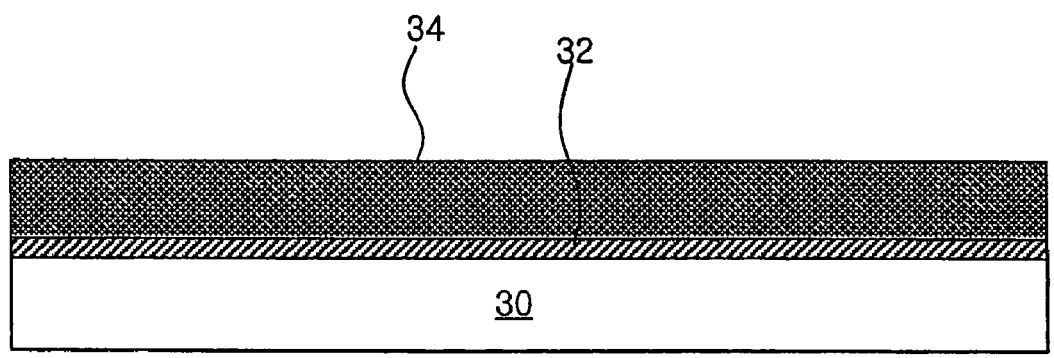
FIGS. 2A to 2E are cross-sectional views of a photolithographic process for forming a metal line according to the related art.
Figure 2B:
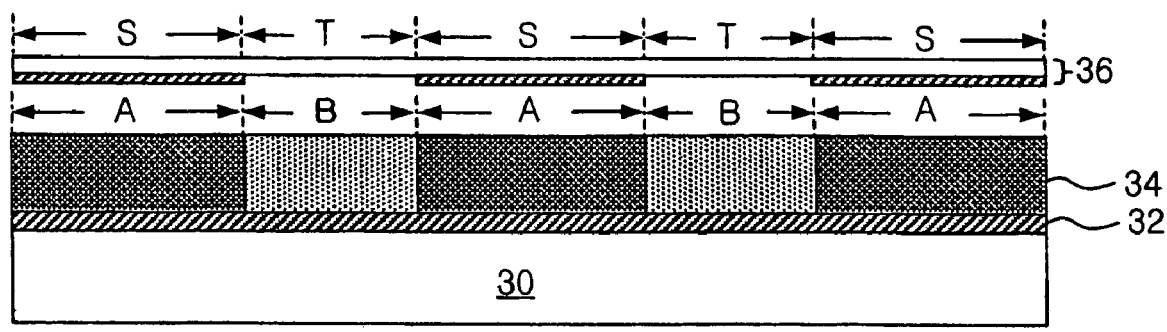
Figure 2C:
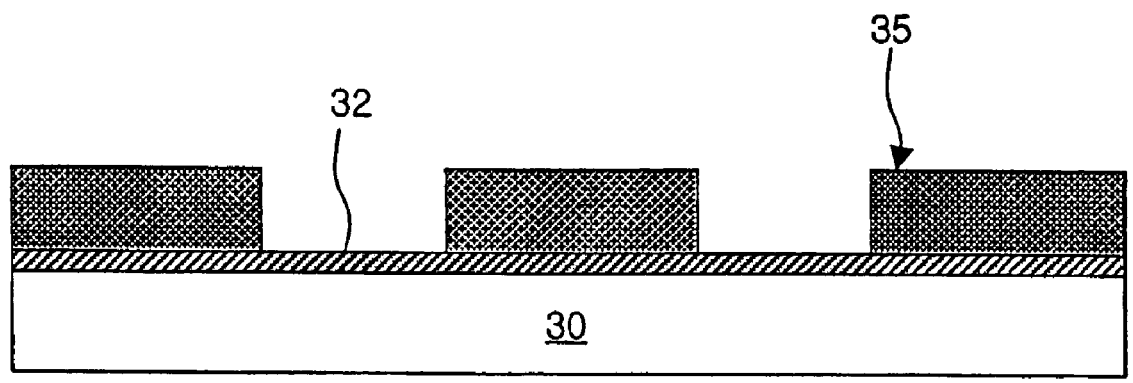
Figure 2D:
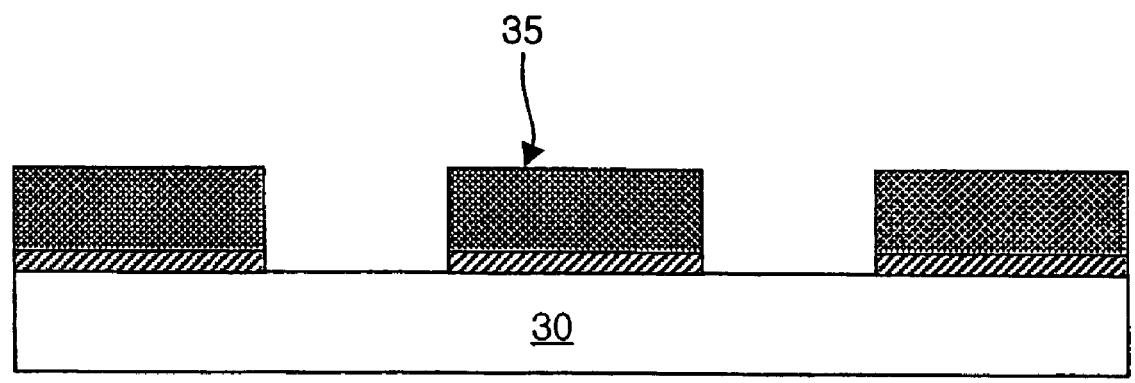
Figure 2E:
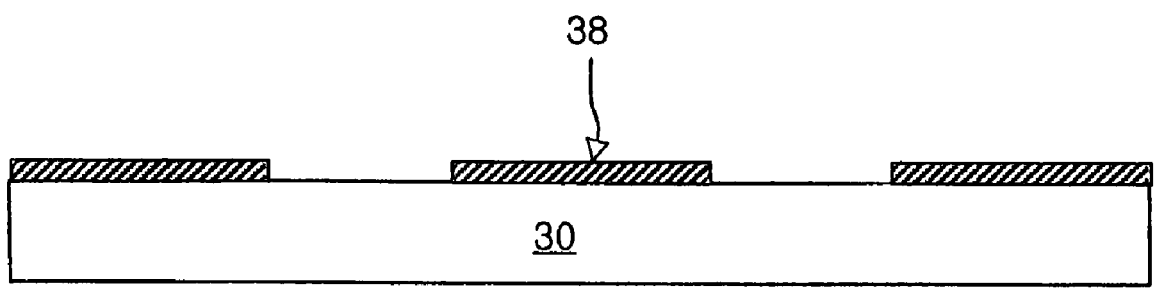
Figure 3:
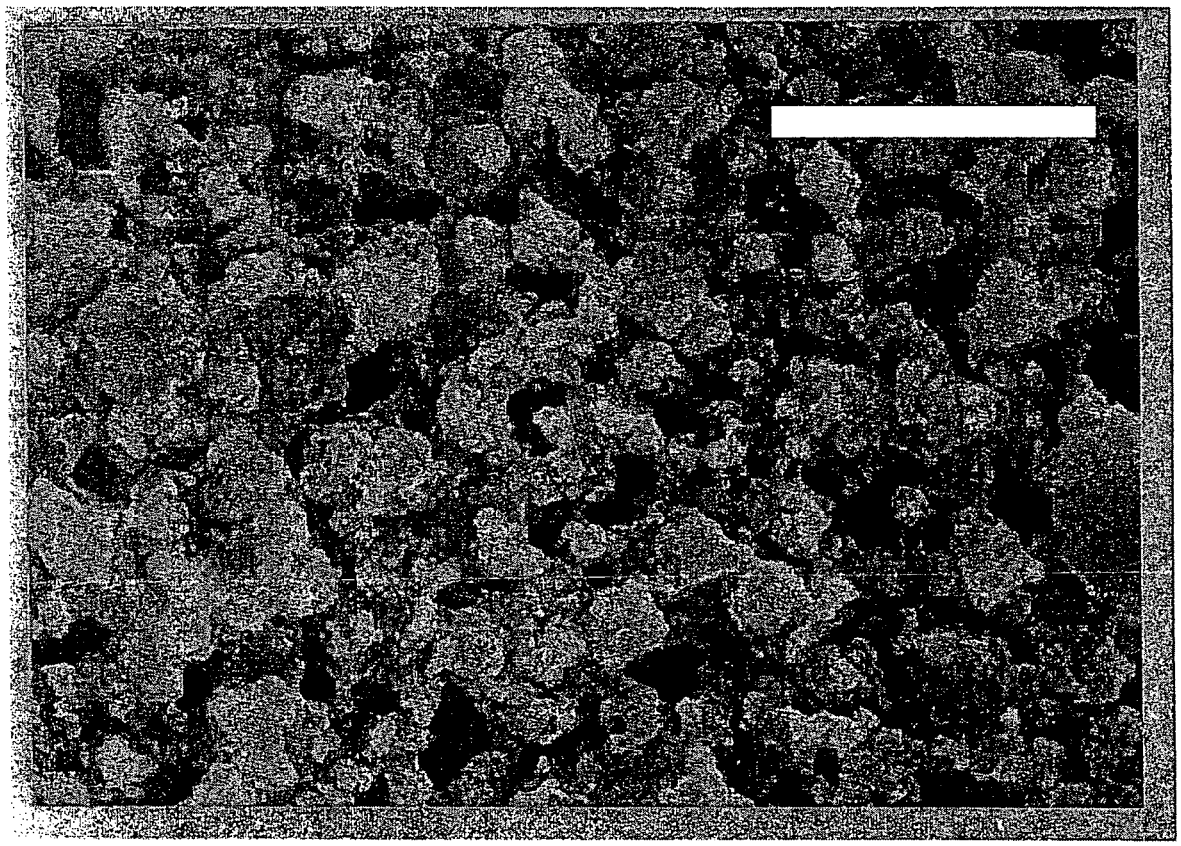
FIG. 3 is a scanning electron microscope (SEM) image showing a corrosion state of an exemplary copper line by a composition including a monoethanolamine according to the present invention.
Figure 4:
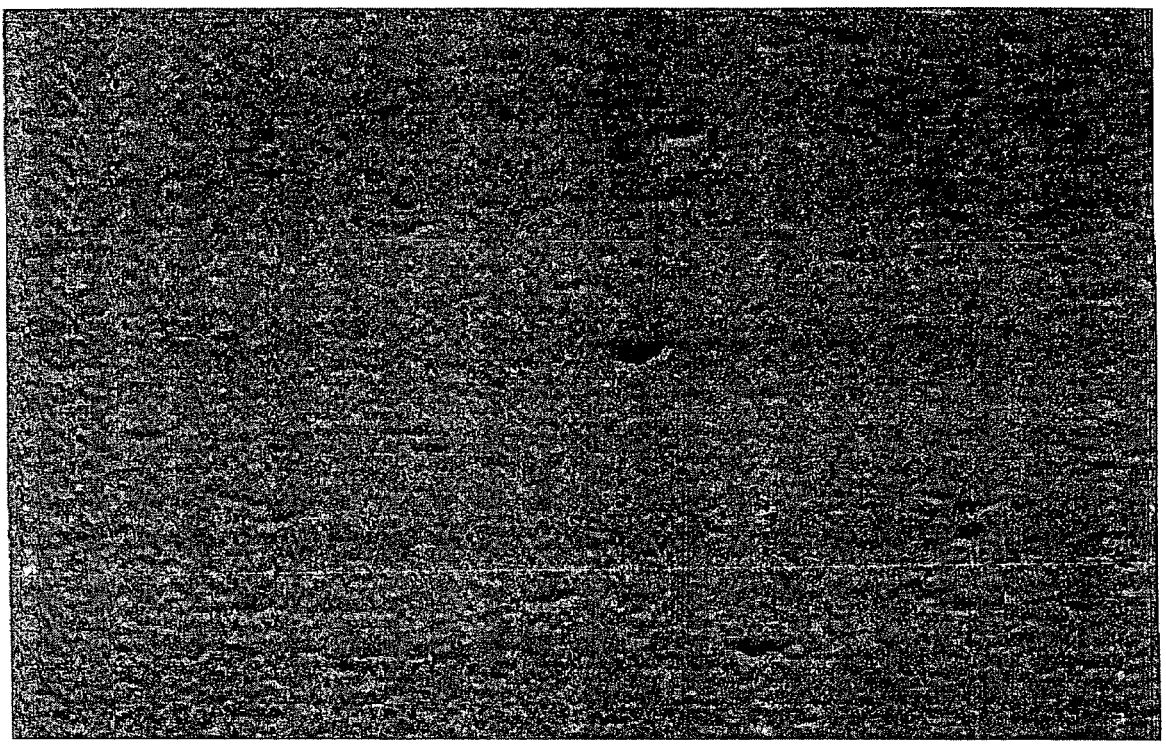
FIG. 4 is a scanning electron microscope (SEM) image showing a corrosion state of another exemplary copper line by a composition including a N-methylethanolamine according to the present invention.

FIG. 3 is a scanning electron microscope (SEM) image showing a corrosion state of an exemplary copper line by a composition including a monoethanolamine according to the present invention, and FIG. 4 is a scanning electron microscope (SEM) image showing a corrosion state of another exemplary copper line by a composition including a N-methylethanolamine according to the present invention. In FIG. 3, a surface of the copper line may not be smooth and may have a severely uneven. On the other hand, the copper line of FIG. 4 may have a relatively smoother surface as compared to the surface shown in FIG. 3. Accordingly, an amine and a solvent which do not corrode the copper may be used, wherein a resist may be removed without corrosion because an excess of a corrosion inhibitor residue. Thus, the corrosion inhibitor may not degrade the removal when the solvent is evaporated.

An exemplary composition for removing a copper-compatible resist according to the present invention may include an amine compound, a glycolether compound, and a polar solvent. The amine compound, which is a strong alkali material, may penetrate into a polymer matrix of a resist that may have been transformed or bridged through a wet or dry etching process or by an ion implantation process, for example. Accordingly, the amine compound may break an attraction of internal molecules or may interrupt an interaction between molecules. The amine compound may transform the resist into a shapeless polymer cluster of a gel state by forming vacancies in weak portions of the resist on the copper line, and the resist may be removed. Accordingly, corrosion may be reduced when an amine having alkyl radical attached to nitrogen (—N) is included by a solvent. Moreover, a secondary amine compound may be better than a tertiary amine compound in order to increase an activity of unshared electron pair of nitrogen (—N—).

Table 1 shows exemplary basicity of the amine compound according to the present invention.

TABLE 1

| | Classification | Structure | Ph 25% AQ sol n |
|---|---|---|---|
| monoethanolamine | primary | $H_2N-CH_2-CH_2-OH$ | 13.04 |
| monoisopropanolamine | primary | $NH_2-CH_2-CH(CH_3)-OH$ | 12.98 |
| N-methylethanolamine | secondary | $CH_3-HN-CH_2-CH_2-OH$ | 13.11 |
| dimethylethanolamine | tertiary | $H_3C-N(CH_3)-CH_2-CH_2-OH$ | 12.77 |
| I diethanolamine | tertiary | $H_3C-CH_2-N(CH_2-CH_3)-CH_2-CH_2-OH$ | 13.00 |

In general, corrosion of copper by the amine compound may be independent of the basicity. The copper may become corroded only by the amine, wherein two hydrogen atoms attached to nitrogen atoms of alkanol (alkyl alcohol) are not substituted. Especially, the corrosion may become severe when the amine ratio of the amine compound is higher than about 30%. Furthermore, since the amine is easily evaporated at temperatures above about 70° C., the amine ratio may not be controllable. Thus, the amine ratio may be preferably within a range of about 10% to about 30% by weight.

Glycolether compounds remove copper-compatible resists by dissolving resin of the resist. If a molecular weight of the glycolether compound is more than about 150, dissolving activity is reduced and solubility of the resist decreases. Accordingly, since a secondary amine compound is used, dissolving activity of the amine compound may also be reduced. Thus, the glycolether compound may preferably have a molecular weight less than about 150.

Compounds without ether bonds, i.e., alkyleneglycol compounds, may corrode a copper line resulting in pinholes on surfaces of the copper line. Conversely, dissolving of amine compounds may be obtained by using diethyleneglycolmethylether or diethyleneglycolethylether, which have boiling points of more than about 180° C. and may be easily mixed with water. Accordingly, even when the resist is removed during a high temperature process, a composition ratio of the glycolether compound may be constant because of the relatively high boiling point of the glycolether compound. Thus, a removal rate of the copper-compatible resist can be made constant throughout the dissolving process. In addition, since the glycolether compound has a boiling point of more than about 180° C., a surface tension between the resist and the copper line may be reduced, thereby increasing resist removal efficiency. Moreover, since the glycolether compound has a relatively low freezing point and a relatively high ignition point, the glycolether compound is relatively safe for storage.

Polar solvents for removing a copper-compatible resist may be selected from the following: N-methyl-2-pyrrolidinone; N,N-dimethylacetamide; N,N-dimethylpormamide and N,N-dimethylimidazole. Polar solvents dissolve polymer clusters of gel state, which are transformed by an amine compound, into unit molecules. Accordingly, the polar solvents prevent re-adhesion of the resist during a cleaning process. Polar solvents such as N-methyl-2-pyrrolidinone include the amine compound, which is a functional group within the molecule, may help the amine compound penetrate into the resist, thereby removing the resist. However, N-methyl-2-pyrrolidinone has a low initial dissolution speed. Accordingly, since N-methyl-2-pyrrolidinone has an tremendous solubility to photosensitive materials, the dissolved photosensitive material may not be educed. Conversely, polar solvents such as N,N-dimethylaceticamide have a high initial dissolution speed, whereby dissolved photosensitive materials may be educed over a period of time and a possibility of re-adhesion increases.

Table 2 shows exemplary corrosion of copper and a removal of resist when an amine compound, a glycolether compound and a polar solvent are individually used according to the present invention. In Table 2, two different types of samples are prepared. A first sample type tests corrosion of copper by forming a copper layer about 2000.ANG. in thickness upon a glass substrate, coating a resist on the copper layer, and developing the resist. A second sample type tests removal of resist by forming a chromium (Cr) layer upon a glass substrate, coating a resist of the chromium layer, wet etching the resist, and treating the resist with a dry etching gas. In addition, in Table 2, monoethanolamine, N-methylethanolamine, N-methyl-2-pyrrolidinone, N,N-dimethvlacetamide, N,N-dimethylpormamide, diethyleneglycolbutylether, and tetraethyleneglycol are selected as solvent compounds.

TABLE 2

|  | Corrosion of copper dipping 70° C. 20 min. | Removal of resist dipping 70° C. 1 min. | |
| --- | --- | --- | --- |
| monoethanolamine | entire corrosion | complete removal | 10 |
| N-ethylethanolamine | entire corrosion | complete removal | 10 |
| N-methyl-2-pyrrolidinone | no corrosion | no removal | 0 |
| N,N-dimethylaceticamide | no corrosion | partial removal | 5 |
| diethyleneglycolethylether | no corrosion | partial removal | 5 |
| diethyleneglycolbutylether | no corrosion | no removal | 0 |
| tetraethyleneglycol | uniform pit | partial removal | 5 |

In Table 2, even though the amine compound such as monoethanolamine and N-ethylethanolamine fully corrode the copper layer of the first sample type, pit formation in the copper layer does not result. Accordingly, the results shown in Table 2 may suggest a controllability of corrosion of the copper layer. Conversely, even though the glycolether compound such as tetraethyleneglycol does not corrode the copper layer, corrosion control may be impossible due to pit formation in the copper layer.

Table 3 shows exemplary corrosion of copper of an amine compound according to the present invention.

TABLE 3

|  | Corrosion of copper dipping 70° C. 400 sec. |
| --- | --- |
| monoethanolamine | 0 |
| monoisopropanolamine | 3 |
| N-methylethanolamine | 10 |
| dimethylethanolamine | 10 |
| diethylethanolamine | 10 |

In Table 3, the solvent compounds of Table 2 that corroded the copper layer were added to a test solution that included an amine compound, 45% by weight of a glycolether compound, and 45% by weight of a polar solvent. Accordingly, different amine compounds were selected including monoethanol, monoisoprpanolamine, N-methylethanolamine, dimethylethanolamine and diethylethanolamine. The test samples were dipped into the test solution at a temperature of about 70° C. for about 400 seconds. As shown in Table 3, the test solution that included 45% by weight of a glycolether compound, 45% by weight of a polar solvent, and one of N-methylethanolamine, dimethylethanolamine and diethylethanolamine never corrodes the Cu layer.

Table 4 shows ratios of a solvent composition for removing a copper-compatible resist according to the present invention.

TABLE 4

| | Composition for removing resist | | | | | | | |
| --- | --- | --- | --- | --- | --- | --- | --- | --- |
| | Amine compound | | Glycolether compound | | Polar solvent | | Additive | |
| | kind | wt % | kind | wt % | kind | wt % | kind | wt % |
| ratio 1 | NMEA | 10 | DEGEE | 80 | NMP | 10 | | |
| ratio 2 | NMEA | 10 | DEGEE | 60 | NMP | 30 | | |
| ratio 3 | NMEA | 10 | DEGEE | 40 | NMP | 50 | | |

TABLE 4-continued

| | Composition for removing resist | | | | | | | |
|---|---|---|---|---|---|---|---|---|
| | Amine compound | | Glycolether compound | | Polar solvent | | Additive | |
| | kind | wt % | kind | wt % | kind | wt % | kind | wt % |
| ratio 4 | NMEA | 10 | DEGEE | 20 | NMP | 70 | | |
| ratio 5 | NMEA | 20 | DEGEE | 70 | NMP | 10 | | |
| ratio 6 | NMEA | 20 | DEGPE | 60 | NMP | 20 | | |
| ratio 7 | NMEA | 30 | DEGPE | 50 | NMP | 20 | | |
| ratio 8 | NMEA | 30 | DEGPE | 10 | NMP | 60 | | |
| comparison ratio 1 | MEA | 10 | DEGBE | 60 | DMAc | 30 | | |
| comparison ratio 2 | MEA | 10 | DEGBE | 45 | NMP | 45 | BT | 2 |
| comparison ratio 3 | NMEA | 10 | DEGEE | 60 | NMP | 30 | 8-HQ | 2 |
| comparison ratio 4 | NMEA | 10 | DEGEE | 90 | | | | |

MEA: monoethanolamine
NMP: N-methyl-2-pyrrolidinone
NMEA: N-methylethanolamine
DMPD: dimethyl-2-piperidone
DEGEE: diethyleneglycolethylether
DMAc: N,N-dimethylaceticamide
DEGPE: diethyleneglycolpropylether
BT: benzotriazole
DEGBE: diethyleneglycolbutylether
8-HQ: 8-hydroxyquinoline In Table 4, comparison ratios 1 and 2, monoethanolamine (MEA) was used as the amine compound. In comparison ratio 2, benzotriazole (BT) was added to the solvent composition as a corrosion inhibitor of the copper layer. In comparison ratio 3, N-methylethanolamine (NMEA) was used as the amine compound, and 8-hydroxyquinoline (8-HQ) was added to the solvent solution as a corrosion inhibitor of the copper layer.

Table 5 shows exemplary removal results of a resist when each composition of Table 4 is used according to the present invention, and Table 6 shows exemplary corrosion results of copper when each composition of Table 4 is used according to the present invention. Three different types of test samples were prepared. A first test sample was about 1 cm×4 cm, and was prepared by etching an active layer (a-Si:H/n+a-Si:H) and removing a resist on the active layer. The second test sample was about 1 cm×4 cm, and was prepared by forming a chromium (Cr) layer on a glass substrate, wet etching, treating with a dry etching gas, and removing a resist on the chromium layer. The third test sample was about 2 cm×4 cm, and was prepared by coating a positive photoresist (DTFR-3650B: Dong-Jin semichem) on a glass, baking the resist at about 170° C. for about 5 minutes, and removing the photoresist. Residual photoresist of the first and second test samples was observed by a scanning electron microscope (SEM) and residual resist of the third test sample was observed by a naked eye. In Tables 5 and 6, a removal degree of the resist is expressed by an integer within a range of 0 to 10, wherein integer 0 indicates no removal of the resist, and integer 10 indicates complete removal of the resist.

TABLE 5

| | (1) dipping 200 sec. | (2) dipping 60 sec. | (3) dipping 50 sec. |
|---|---|---|---|
| ratio 1 | 10 | 10 | 7 |
| ratio 2 | 10 | 10 | 5 |
| ratio 3 | 10 | 10 | 8 |
| ratio 4 | 10 | 10 | 7 |
| ratio 5 | 10 | 10 | 8 |
| ratio 6 | 10 | 10 | 10 |
| ratio 7 | 10 | 10 | 3 |

TABLE 5-continued

| | (1) dipping 200 sec. | (2) dipping 60 sec. | (3) dipping 50 sec. |
|---|---|---|---|
| ratio 8 | 10 | 10 | 8 |
| comparison ratio 1 | 5 | 2 | 0 |
| comparison ratio 4 | 2 | 1 | 0 |

0: no removal
10: complete removal

TABLE 6

| | (4) dipping 400 sec. |
|---|---|
| ratio 1 | 10 |
| ratio 2 | 10 |
| ratio 3 | 10 |
| ratio 4 | 10 |
| ratio 5 | 10 |
| ratio 6 | 10 |
| ratio 7 | 10 |
| ratio 8 | 10 |
| comparison ratio 1 | 0 |
| comparison ratio 2 | 0 |
| comparison ratio 3 | 5 (severe pit) |

In Tables 5 and 6, the polar solvent corrodes even the active layer in the case of comparison ratio 4. In the case of ratios 1 to 8 of Table 5, the resist treated with the dry etching gas is completely removed. Conversely, in the case of comparison ratio 4 of Table 5, the resist is not removed. Accordingly, solubility of the hardened resist is high in ratios 1 to 8, and solubility of the hardened resist is low in comparison ratio 4.

In the case of comparison ratios 1 and 2 of Table 6, the composition including monoethanolamine (MEA) severely corrodes the copper layer. For the comparison ratio 2, even though benzotriazole (BT) includes a complex with copper and an unshared electron pair of nitrogen (N) is added as a corrosion inhibitor, BT is deficient in preventing corrosion of the copper. For the comparison ratio 3, even though 8-hydroxyquinoline (8-HQ) is added as a corrosion inhibitor, a pit is generated in the copper layer because an unshared electron pair of the nitrogen does not include a complex with the copper.

Therefore, an exemplary composition for removing copper-compatible resist may be suggested as follows according to the present invention. The solvent composition may include about 10% to about 30% by weight of an amine compound, about 10% to about 80% by weight of a glycolether compound, and about 10% to about 80% by weight of a polar solvent. The amine compound may be selected from a group that includes N-methylethanolamine, N-ethylethanolamine, diethylethanolamine and dimethylethanolamine. The glycolether compound may be selected from a group that includes ethyleneglycolethylether, ethyleneglycolmethylether, ethyleneglycolbutylether, diethyleneglycolbutylether, diethyleneglycolethylether, diethyleneglycolmethylether and diethyleneglycoipropylether. The polar solvent may be selected from a group that includes N-methyl-2-pyrrolidinone, N,N-dimethvlacetamide, N,N-dimethvlpormamide and N,N-dimethylimidazole.

In the present invention, it may be preferable to use N-methylethanolamine as the amine compound, diethyleneglycolethylether or diethyleneglycolpropylether as the glycolether compound, and N-methyl-2-pyrrolidinone as the polar solvent.

It will be apparent to those skilled in the art that various modifications and variations can be made in the organic electroluminescent display of the present invention without departing from the spirit or scope of the invention. Thus, it is intended that the present invention cover the modifications and variations of this invention provided they come within the scope of the appended claims and their equivalents.

What is claimed is:

1. A method for removing a copper-compatible resist, comprising:
   providing a composition, including combining about 10% to about 30% by weight of an amine compound with about 10% to about 80% by weight of a glycolether compound and about 10% to about 80% by weight of a polar solvent, wherein the composition consists of only three materials which are the amine compound, the glycolether compound and the polar solvent; and
   removing a copper-compatible resist using the composition.

2. The method according to claim 1, wherein the amine compound includes at least one of N-methylethanolamine, N-ethyletanolamine, diethylethanolamine and dimethylethanolamine.

3. The method according to claim 1, wherein the glycolether compound includes at least one of ethyleneglycolethylether, ethyleneglycolmethylether, ethyleneglycolbutylether, diethyleneglycolbutylether, diethyleneglycolethylether, diethyleneglycolmethylether and diethyleneglycolpropylether.

4. The method according to claim 1, wherein the glycolether compound has a boiling point more than about 180° C.

5. The method according to claim 1, wherein the polar solvent includes at least one of N-methyl-2-pyrrolidinone, N,N-dimethylacetamide, N,N-dimethylpormamide and N,N-dimethylimidazole.

6. The method according to claim 1, wherein the amine compound includes N-methylethanolamine, the glycolether compound includes at least one of diethyleneglycolethylether and diethyleneglycolpropylether, and the polar solvent includes N-methyl-2-pyrrolidinone.

7. The method according to claim 1, wherein the glycolether compound has a molecular weight of less than about 150.

* * * * *